United States Patent
Hougham et al.

(10) Patent No.: US 9,410,261 B2
(45) Date of Patent: Aug. 9, 2016

(54) TWO MASK PROCESS FOR ELECTROPLATING METAL EMPLOYING A NEGATIVE ELECTROPHORETIC PHOTORESIST

(71) Applicant: GLOBALFOUNDRIES INC., Grand Cayman (KY)

(72) Inventors: Gareth G. Hougham, Ossining, NY (US); Gerard McVicker, Stormville, NY (US); Anna Pratt, Wallkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/528,028

(22) Filed: Oct. 30, 2014

(65) Prior Publication Data

US 2015/0060266 A1    Mar. 5, 2015

Related U.S. Application Data

(62) Division of application No. 13/584,326, filed on Aug. 13, 2012.

(51) Int. Cl.

| | |
|---|---|
| *C25D 17/12* | (2006.01) |
| *G03F 7/20* | (2006.01) |
| *G03F 7/00* | (2006.01) |
| *C25D 1/00* | (2006.01) |
| *C25D 5/02* | (2006.01) |
| *C25D 13/00* | (2006.01) |

(52) U.S. Cl.
CPC ............... *C25D 17/12* (2013.01); *C25D 1/003* (2013.01); *C25D 5/022* (2013.01); *G03F 7/0037* (2013.01); *G03F 7/203* (2013.01); *G03F 7/2022* (2013.01); *C25D 13/00* (2013.01); *Y10T 428/24562* (2015.01)

(58) Field of Classification Search
CPC ....................................................... H01L 21/32
USPC ..................................... 204/290.01; 430/324
See application file for complete search history.

(56) References Cited

U.S. PATENT DOCUMENTS

| | | |
|---|---|---|
| 5,861,327 A | 1/1999 | Maeng et al. |
| 5,928,815 A | 7/1999 | Martin |
| 6,391,773 B2 | 5/2002 | Andricacos et al. |
| 2011/0108316 A1 | 5/2011 | Hougham et al. |
| 2011/0111647 A1* | 5/2011 | Hougham ............ H01L 21/486 439/884 |
| 2011/0236833 A1 | 9/2011 | Chan |

OTHER PUBLICATIONS

Jeon, S. et al., "Fabricating Complex Three-Dimensional Nanostructures with High-Resolution Conformable Phase Masks" PNAS (Aug. 24, 2004) pp. 12428-12433, vol. 101, No. 34.
Beuret, C. et al., "Microfabrication of 3D Multidirectional Inclined Structures by UV Lithography and Electroplating" IEEE Workshop on Micro Electro Mechanical Systems (Jan. 25-28, 1994) pp. 81-85.
Notice of Allowance issued on Jan. 15, 2016 in U.S. Appl. No. 13/584,326.

* cited by examiner

*Primary Examiner* — Daborah Chacko Davis
(74) *Attorney, Agent, or Firm* — Scully Scott Murphy and Presser

(57) ABSTRACT

A negative electrophoretic photoresist is applied over a plurality of protruding disposable template portions on a substrate. A silo structure is placed on planar portions of the negative electrophoretic photoresist that laterally surround the plurality of protruding disposable template portions. The negative electrophoretic photoresist is lithographically exposed employing the silo structure and a first lithographic mask, which includes a transparent substrate with isolated opaque patterns thereupon. After removal of the silo structure, the negative electrophoretic photoresist is lithographically exposed employing a second lithographic mask, which includes a pattern of transparent areas overlying the planar portions of the negative electrophoretic photoresist less the areas for bases of metal structure to be subsequently formed by electroplating. The negative electrophoretic photoresist is developed to form cavities therein, and metal structures are formed by electroplating within the cavities. The negative electrophoretic photoresist and the plurality of protruding disposable template portions can be subsequently removed.

15 Claims, 22 Drawing Sheets

TWO MASK PROCESS FOR ELECTROPLATING METAL EMPLOYING A NEGATIVE ELECTROPHORETIC PHOTORESIST

CROSS REFERENCE TO RELATED APPLICATION

This application is a divisional of U.S. patent application Ser. No. 13/584,326, filed Aug. 13, 2012 the entire content and disclosure of which is incorporated herein by reference.

STATEMENT REGARDING FEDERALLY SPONSORED RESEARCH OR DEVELOPMENT

This invention was made with United States government support under Prime Contract No. HR0011-07-9-0002 awarded by the Defense Advanced Research Projects Agency (DARPA). The United States government has certain rights in this invention.

BACKGROUND

The present disclosure relates to a method for electroplating metal employing a negative electrophoretic photoresist and two lithographic masks, and a structure for implementing the same.

While a positive photoresist or a negative photoresist can be employed to define a cavity for electroplating, commercially available negative photoresists tend to provide better material property such as mechanical adhesion (less brittleness) than commercially available positive photoresists. If a negative type photoresist is employed for the electroplating process, the cavity is defined by blocking light to the area of the cavity during a lithographic exposure.

In ordinary photolithographic processes, mask features include optically opaque areas supported by a transparent glass substrate. Accordingly, opaque areas can sit in isolation on a surface of the transparent glass substrate when such an isolated feature is desired. However, if a physical shadow mask including a metal plate and openings therethrough is used, an isolated light-blocking portion of the metal mask cannot be suspended within the metal plate. In other words, only light-blocking portions of the metal mask that are connected to the remainder of the metal mask can be present as a pattern in the shadow mask.

SUMMARY

A plurality of protruding disposable template portions can be formed on a substrate. A negative electrophoretic photoresist is applied over the plurality of protruding disposable template portions. A silo structure including a plurality of openings overlying the plurality of protruding disposable template portions is placed on planar portions of the negative electrophoretic photoresist that laterally surround the plurality of protruding disposable template portions. A first lithographic mask including a transparent substrate with isolated opaque patterns thereupon is placed over the silo structure. The portions of the negative electrophoretic photoresist over the plurality of protruding disposable template portions are lithographically exposed. After removal of the silo structure, the negative electrophoretic photoresist is lithographically exposed employing a second lithographic mask, which includes a pattern of transparent areas overlying the planar portions of the negative electrophoretic photoresist less the areas for bases of metal structure to be subsequently formed by electroplating. The negative electrophoretic photoresist is developed to form cavities therein, and metal structures are formed by electroplating within the cavities. The negative electrophoretic photoresist and the plurality of protruding disposable template portions can be subsequently removed.

According to an aspect of the present disclosure, a method of forming three-dimensional metallic structures is provided. A plurality of protruding disposable template portions is formed on a substrate. A photoresist is applied over the plurality of protruding disposable template portions. Planar portions of the photoresist are present among the plurality of protruding disposable template portions. A silo structure including a plurality of openings is disposed on the planar portions of the photoresist. The plurality of openings overlies the plurality of protruding disposable template portions. A first lithographic mask is disposed over the silo structure. The photoresist is lithographically exposed employing the first lithographic mask and the silo structure. The photoresist is lithographically exposed employing a second lithographic mask after removing the silo structure from above the photoresist. A plurality of cavities is formed within remaining portions of the photoresist by developing the photoresist. Three dimensional metallic structures are formed by depositing at least one metallic material in the plurality of cavities.

According to another aspect of the present disclosure, a lithographic structure includes a plurality of protruding disposable template portions located on a substrate, and a photoresist disposed over the plurality of protruding disposable template portions. Planar portions of the photoresist are present among the plurality of protruding disposable template portions. The lithographic structure further includes a silo structure including a plurality of openings and disposed on the planar portions of the photoresist, wherein the plurality of openings overlies the plurality of protruding disposable template portions, and a lithographic mask located over the silo structure.

DETAILED DESCRIPTION

Figure 1A:
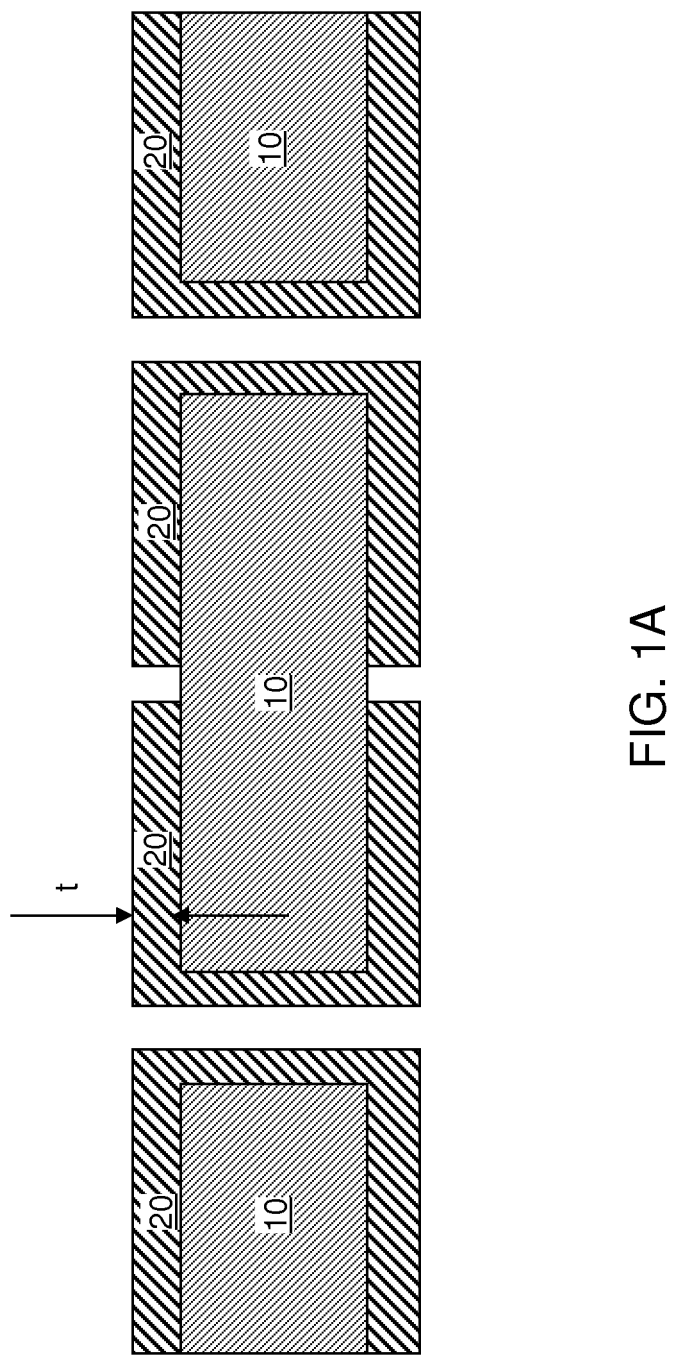
FIG. 1A is a vertical cross-sectional view of a first exemplary structure after formation of metallic pads on a substrate according to an embodiment of the present disclosure.

As stated above, the present disclosure relates to a method for electroplating metal employing a negative electrophoretic photoresist and two lithographic masks, and a structure for implementing the same, which are now described in detail with accompanying figures. It is noted that like and corresponding elements mentioned herein and illustrated in the drawings are referred to by like reference numerals.

Figure 1B:
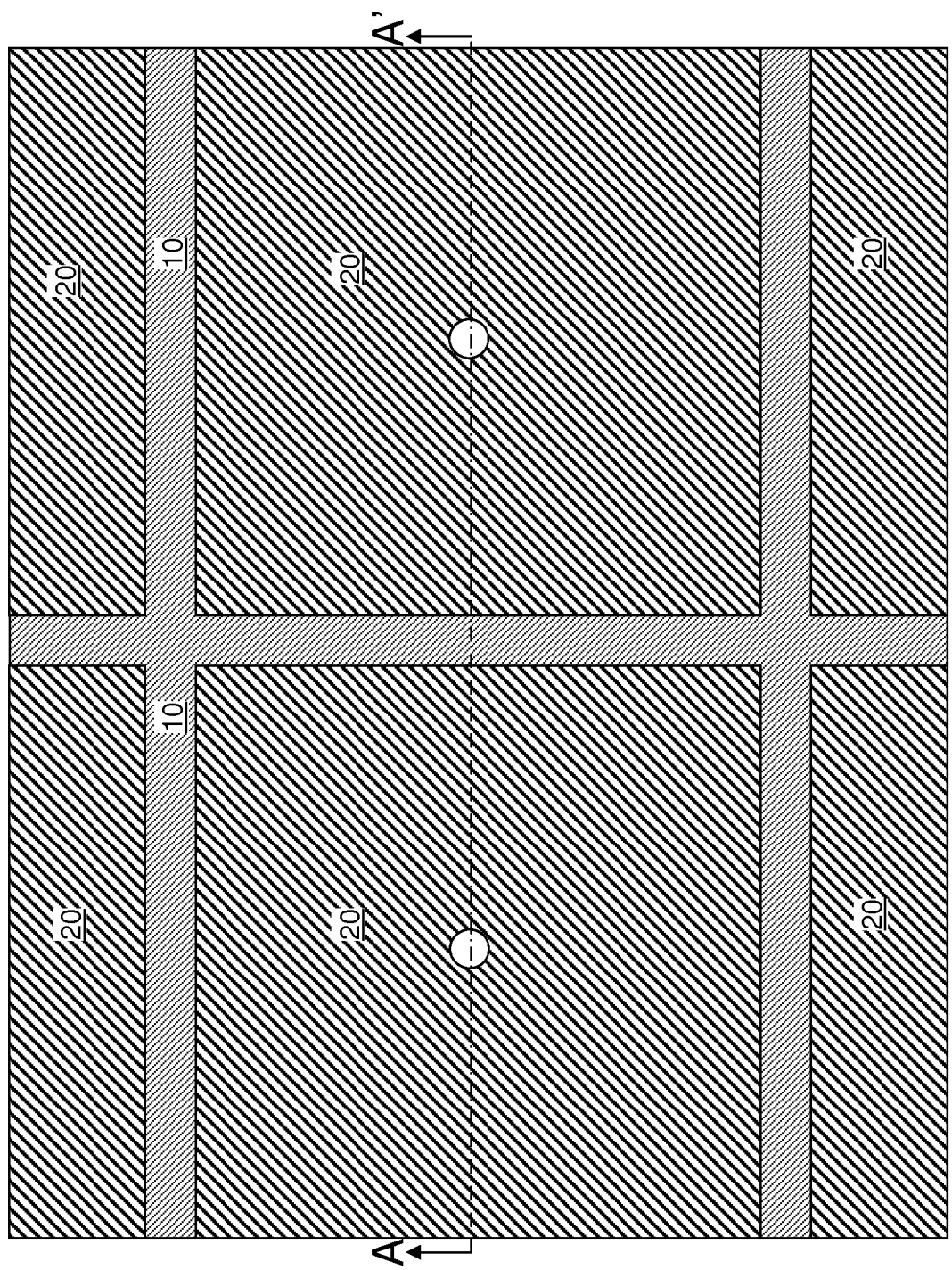
FIG. 1B is a top-down view of the first exemplary structure of FIG. 1A. A vertical plane A-A' represents the vertical cross-sectional plane of FIG. 1A.

Referring to FIGS. 1A and 1B, a first exemplary structure according to an embodiment of the present disclosure includes a substrate 10 and a plurality of metallic pads 20 formed thereupon. The substrate 10 can be a dielectric substrate, a semiconductor substrate, or a conductive substrate. In one embodiment, the substrate 10 can be a dielectric substrate including a plurality of holes therethrough. The thickness of the substrate can be from 50 micron to 1 cm, although lesser and greater thicknesses can also be employed. The lateral dimension (e.g., a diameter) of each hole, if present, through the substrate 10 can be, for example, from 50 microns to 5 mm, although lesser and greater lateral dimensions can also be employed.

The plurality of metallic pads 20 can be formed on one side of the substrate 10, or on both sides of the substrate 10. In one embodiment, the plurality of metallic pads 20 can be formed on both sides of the substrate 10 such that the a metallic pad 20 extends through a hole in the substrate 10 and have a first metallic pad portion located on one side of the substrate 10 and a second metallic pad portion located on the opposite side of the substrate 10. The plurality of metal pads 20 can be formed, for example, by deposition of a metallic material layer and patterning of the metallic material layer. The metallic material layer can be deposited, for example, by physical vapor deposition (PVD), chemical vapor deposition (CVD), electroplating, electroless plating, or a combination thereof. The thickness t of each metallic pad 20 can be, for example, from 1 micron to 500 microns, although lesser and greater thicknesses can also be employed. The lateral dimensions of each metallic pad 20 (e.g., the length of one side of a rectangular metallic pad) can be from 30 microns to 3 mm, although lesser and greater lateral dimensions can also be employed.

Figure 2A:
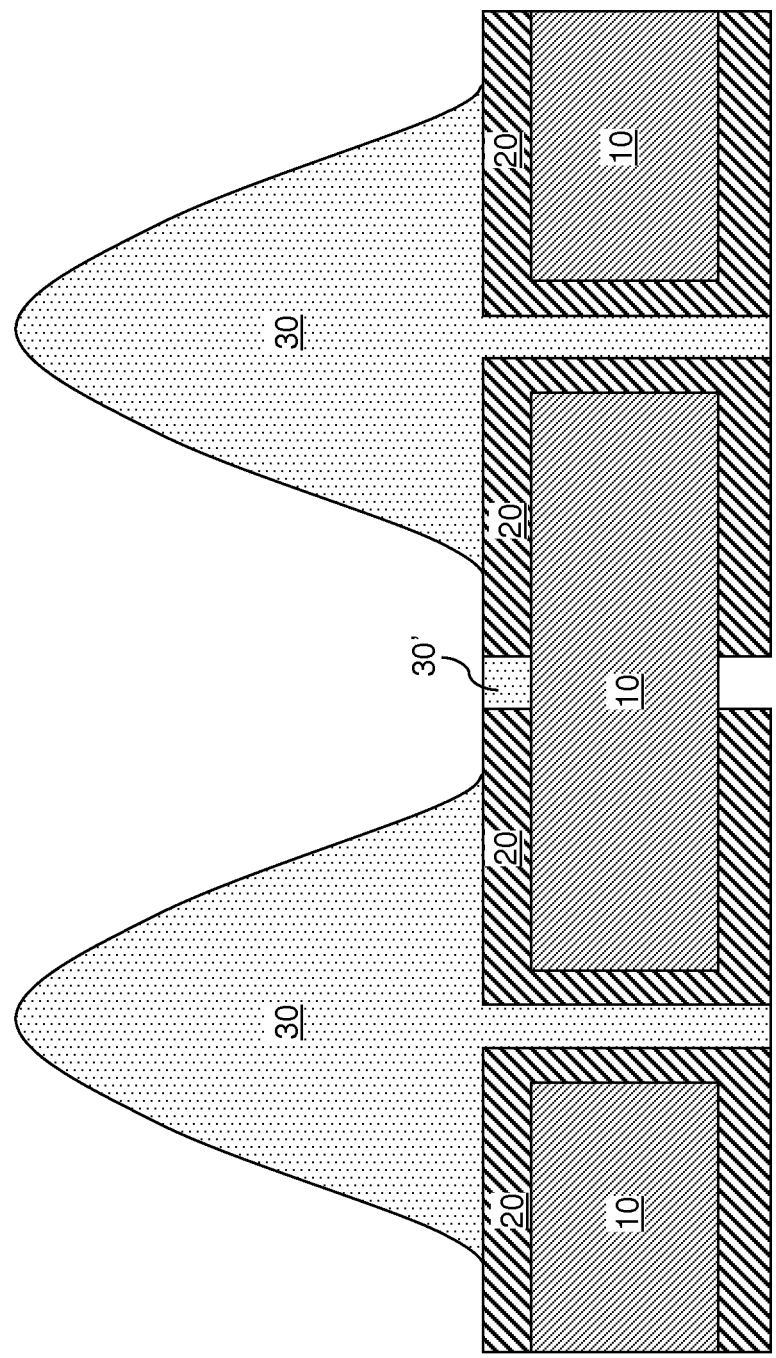
FIG. 2A is a vertical cross-sectional view of the first exemplary structure after formation of a plurality of protruding disposable template portions according to an embodiment of the present disclosure.
Figure 2B:
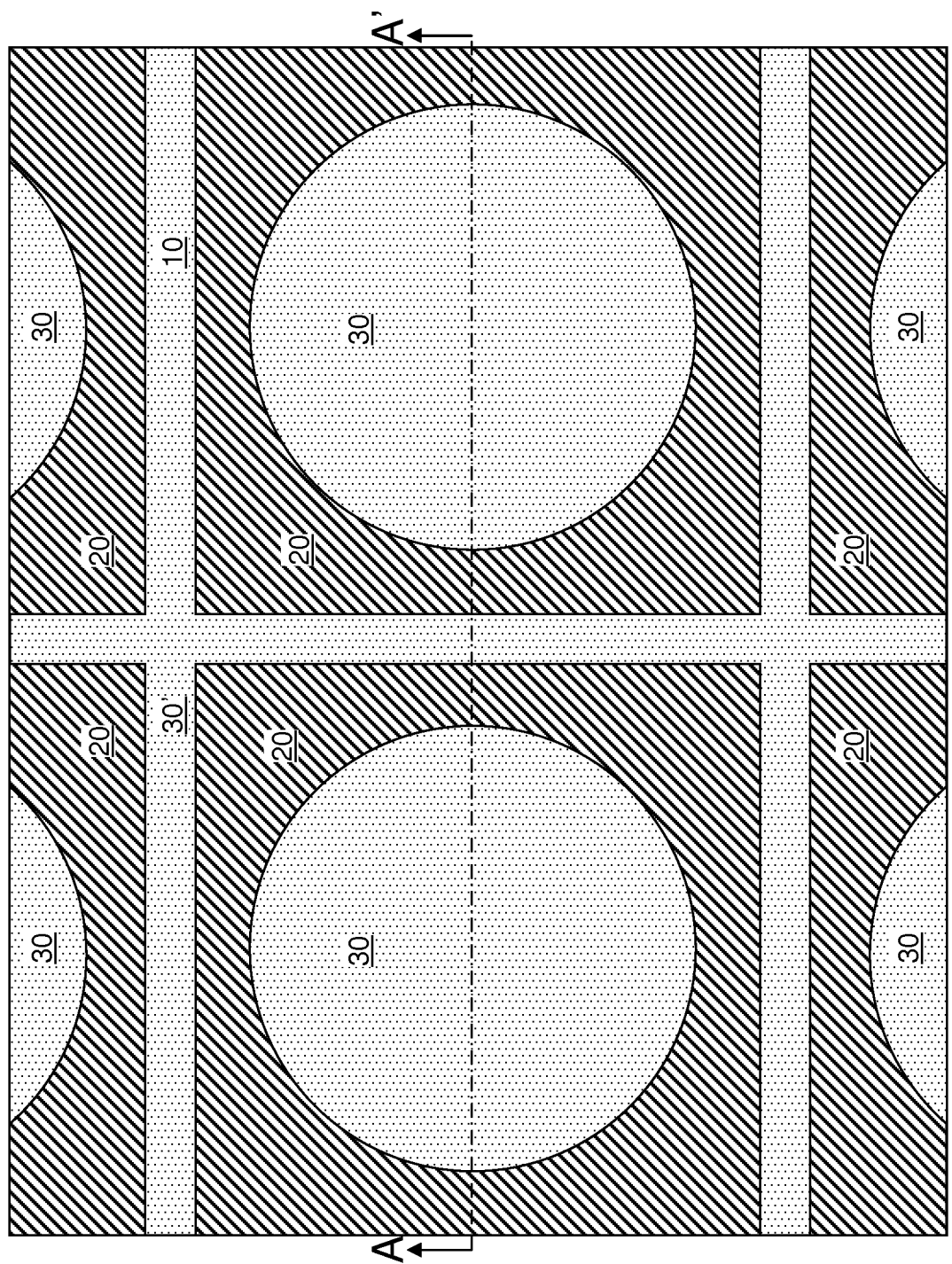
FIG. 2B is a top-down view of the first exemplary structure of FIG. 2A. A vertical plane A-A' represents the vertical cross-sectional plane of FIG. 2A.

Referring to FIGS. 2A and 2B, a plurality of protruding disposable template portions 30 is formed directly on the plurality of metallic pads 20. Each of the plurality of protruding disposable template portions 30 protrudes above from the top surface of the plurality of metallic pads 20. The plurality of protruding disposable template portions 30 can be any type of disposable material that can be formed as localized clusters. In one embodiment, the plurality of protruding disposable template portions 30 can include polymer bumps. In one embodiment, the polymer bumps can be formed by depositing a polymer layer having a uniform thickness, by applying a photoresist layer thereupon, lithographically patterning the photoresist layer to form an array of isolated photoresist portions (e.g., an array of isolated photoresist cylinders), by transferring the pattern in the photoresist layer employing an anisotropic etch with a polymer reflow during the etch, and by removing the patterned photoresist layer. In another embodiment, the polymer bumps can be formed by sputtering a polymer material employing a mesh-style mask disposed overlying the combination of the substrate 10 and the plurality of metallic pads 20. In yet another embodiment, the polymer bumps can be formed by transferring a polymer material from a mold to the surface of the plurality of metallic pads 20. Optionally, the polymer material can be reflowed to flow into an array of holes through the substrate 10 if holes are present in the substrate 10.

In one embodiment, the polymer material can be deposited over the entirety of the substrate 10 with periodic thickness variations, and the polymer material can be recessed, for example, with an isotropic etch or an anisotropic etch so that peripheral portions of each metallic pad 20 are physically exposed. In one embodiment, a polymer material portion 30' including the same material as the plurality of protruding disposable template portions 30 can be formed between each neighboring pair of metallic pads 20. The plurality of protruding disposable template portions 30 and the physically exposed portions of the plurality of metallic pads 20 can collectively function as a non-planar template for subsequently depositing additional materials.

Figure 3:
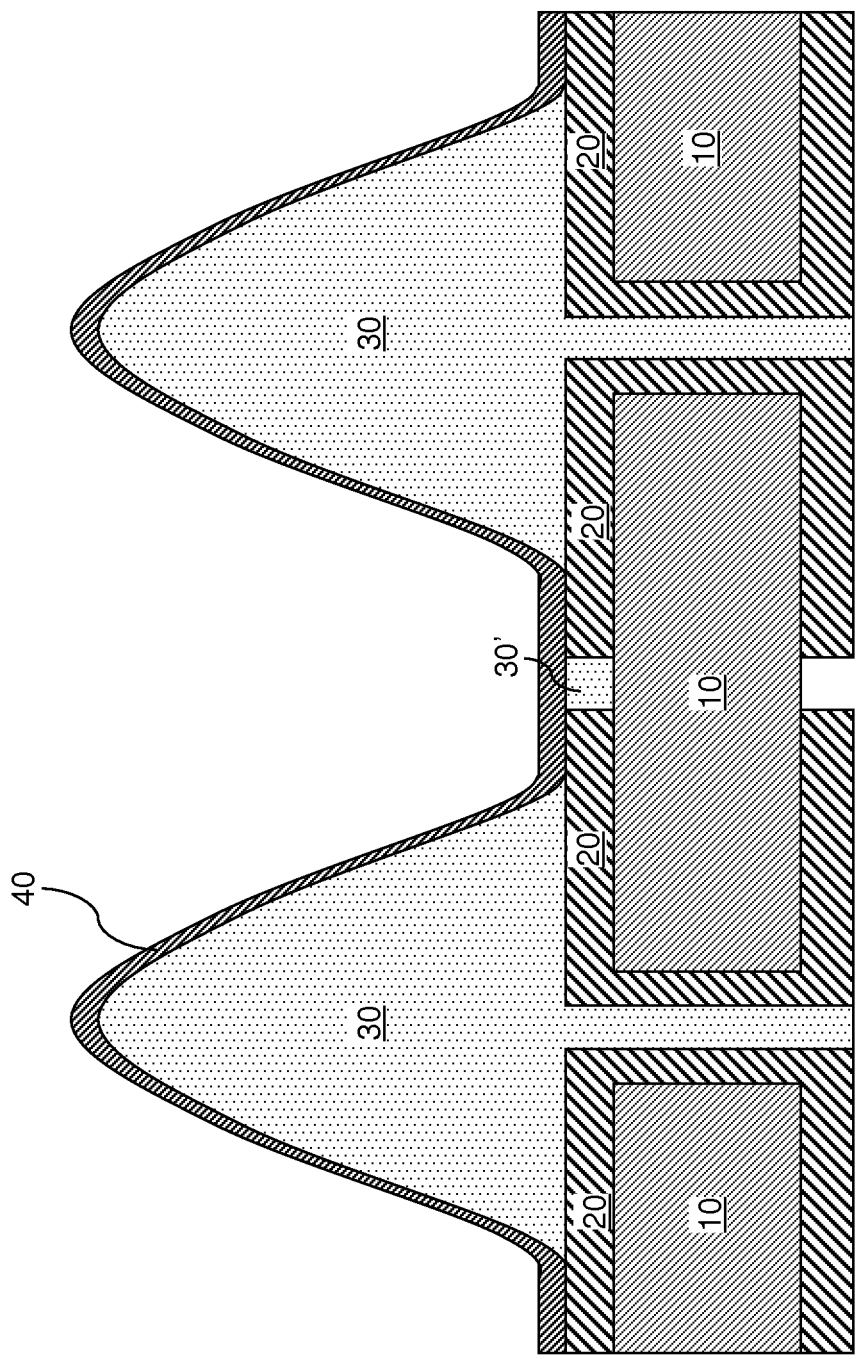
FIG. 3 is a vertical cross-sectional view of the first exemplary structure after formation of a metallic seed layer according to an embodiment of the present disclosure.

Referring to FIG. 3, a metallic seed layer 40 is deposited on the physically exposed surfaces of the plurality of protruding disposable template portions 30, the plurality of metallic pads 20, and the polymer material portions 30' (if present). The metallic seed layer 40 can be deposited, for example, by physical vapor deposition. In one embodiment, the metallic seed layer 40 can be a copper layer having a thickness in a range from 10 nm to 1 micron.

Figure 4:
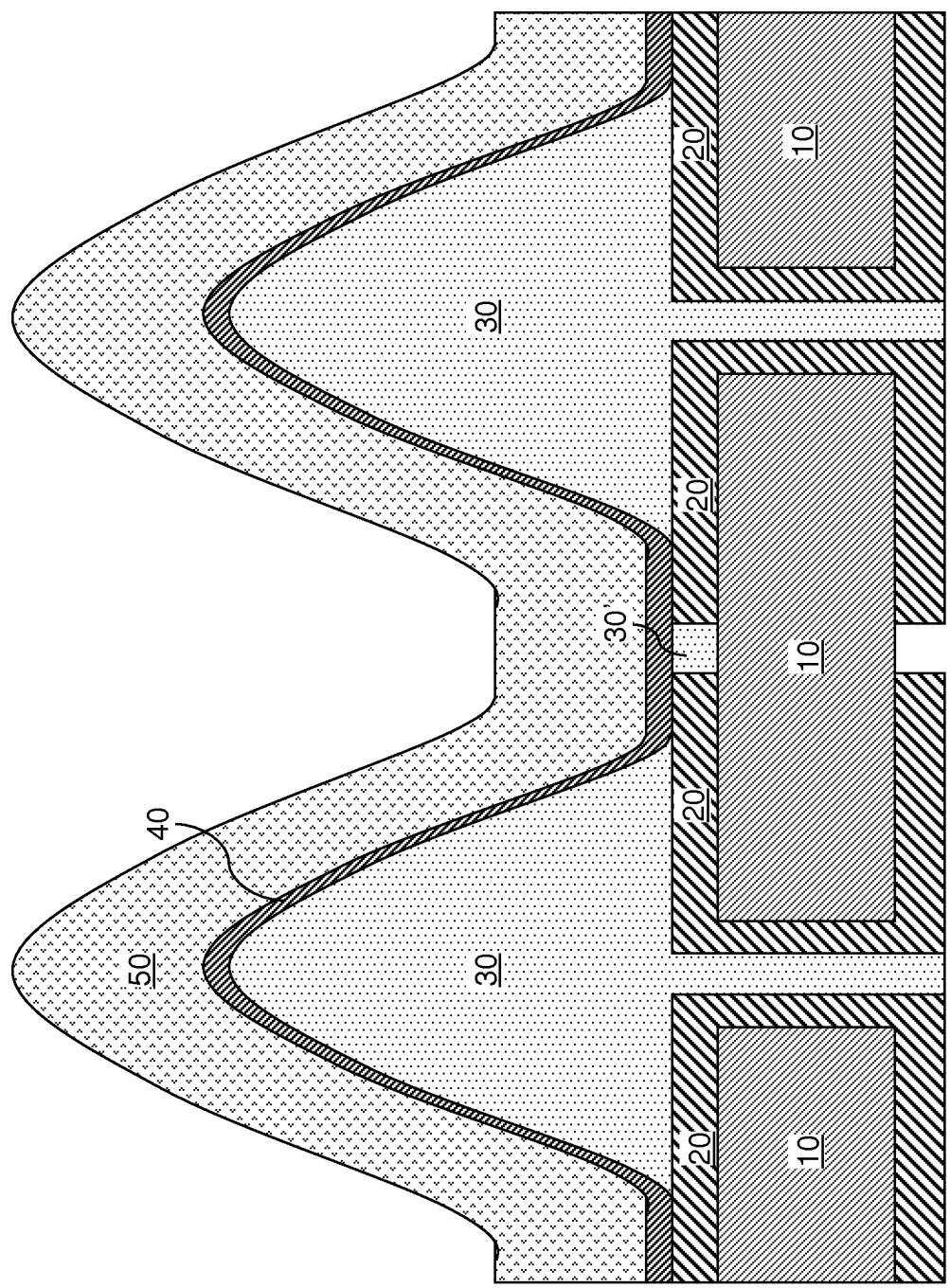
FIG. 4 is a vertical cross-sectional view of the first exemplary structure after application of a photoresist layer according to an embodiment of the present disclosure.

Referring to FIG. 4, a layer of a photoresist 50 can be applied on the entire top surface of the metallic seed layer 40. The photoresist 50 is applied over the plurality of protruding disposable template portions 30. The photoresist 50 is not self-planarizing, and the contour of the top surface of the photoresist 50 follows the general contour of the underlying surfaces of the plurality of protruding disposable template portions 30 and the top surfaces of the portions of the plurality of metallic pads 20 that do not underlie the plurality of protruding disposable template portions 30.

Non-planar portions of the photoresist 50 can be present over the plurality of protruding disposable template portions 30. Planar portions of the photoresist 50 can be present among the plurality of protruding disposable template portions 30. In other words, a set of protruding disposable template portions 30 can be present along the periphery of each planar portion of the photoresist 50.

In one embodiment, the photoresist 50 can be an electrophoretic photoresist, i.e., a photoresist that can be deposited by electrophoresis. Electrophoresis refers to the motion of dispersed particles relative to a fluid under the influence of a spatially uniform electric field. The thickness of the photoresist 50 can be substantially uniform because the entirety of the top surface of the first exemplary structure is the surface of the metallic seed layer 40 prior to the electrophoresis that deposits the electrophoretic photoresist.

In one embodiment, the photoresist 50 can be a negative electrophoretic photoresist, i.e., an electrophoretic photoresist that is also a negative photoresist. A negative photoresist is a photoresist that includes a material that cross-links upon irradiation by electromagnetic radiation. The cross-linked portions of a negative photoresist become insoluble in a solvent that removes the unirradiated portions (that do not have cross-linking) of the negative photoresist.

An exemplary negative electrophoretic photoresist that can be employed for the photoresist 50 of the present disclosure is Intervia™ by Dow Chemical™. The thickness of the photoresist 50, as measured in a planar portion thereof, can be from 0.5 micron to 100 microns, although lesser and greater thicknesses can also be employed.

Figure 5A:
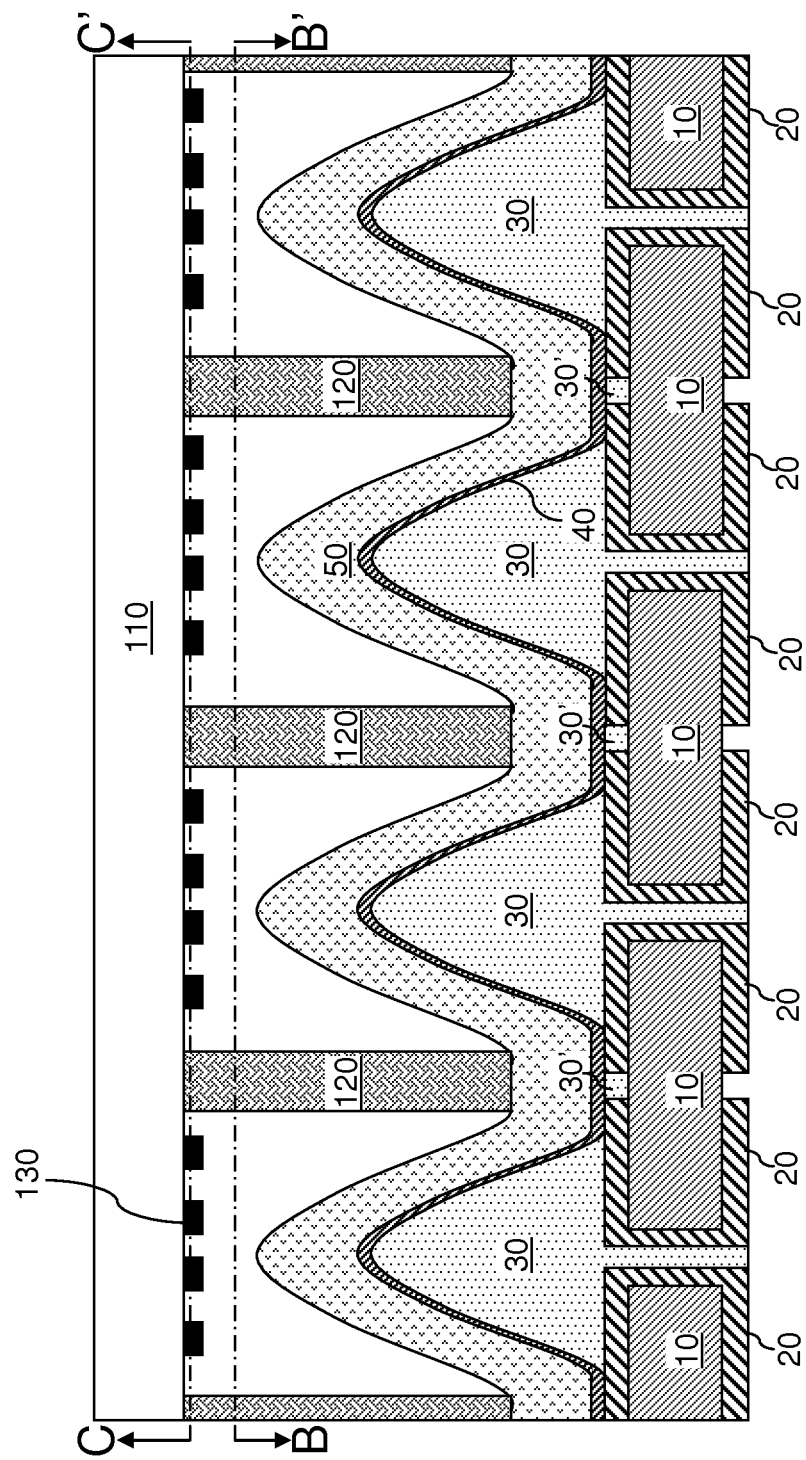
FIG. 5A is a vertical cross-sectional view of the first exemplary structure after placement of a silo structure and a first lithographic mask over the substrate according to an embodiment of the present disclosure.
Figure 5B:
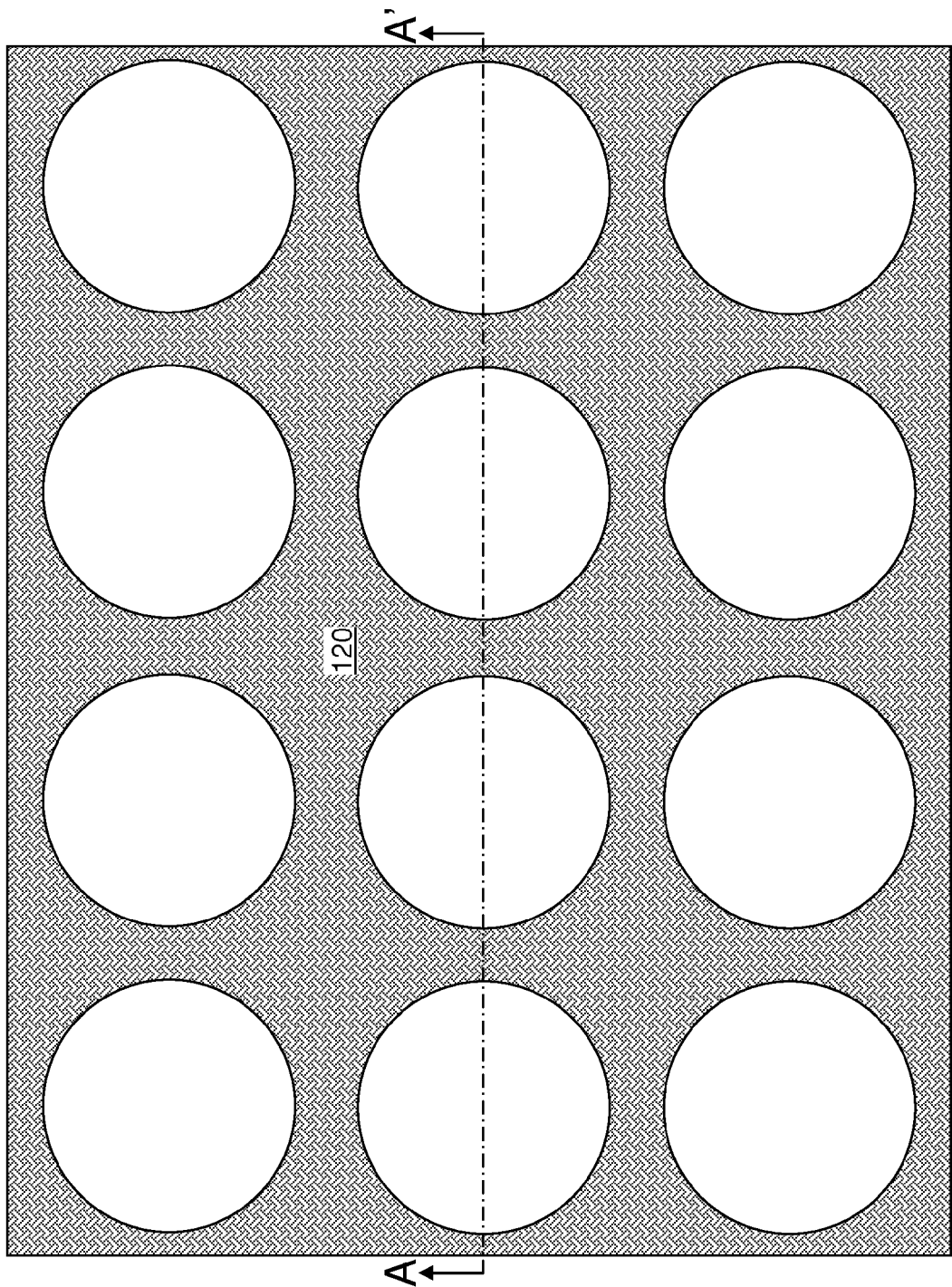
FIG. 5B is a horizontal cross-sectional view of the first exemplary structure along the plane B-B' in FIG. 5A. A vertical plane A-A' represents the vertical cross-sectional plane of FIG. 5A.
Figure 5C:
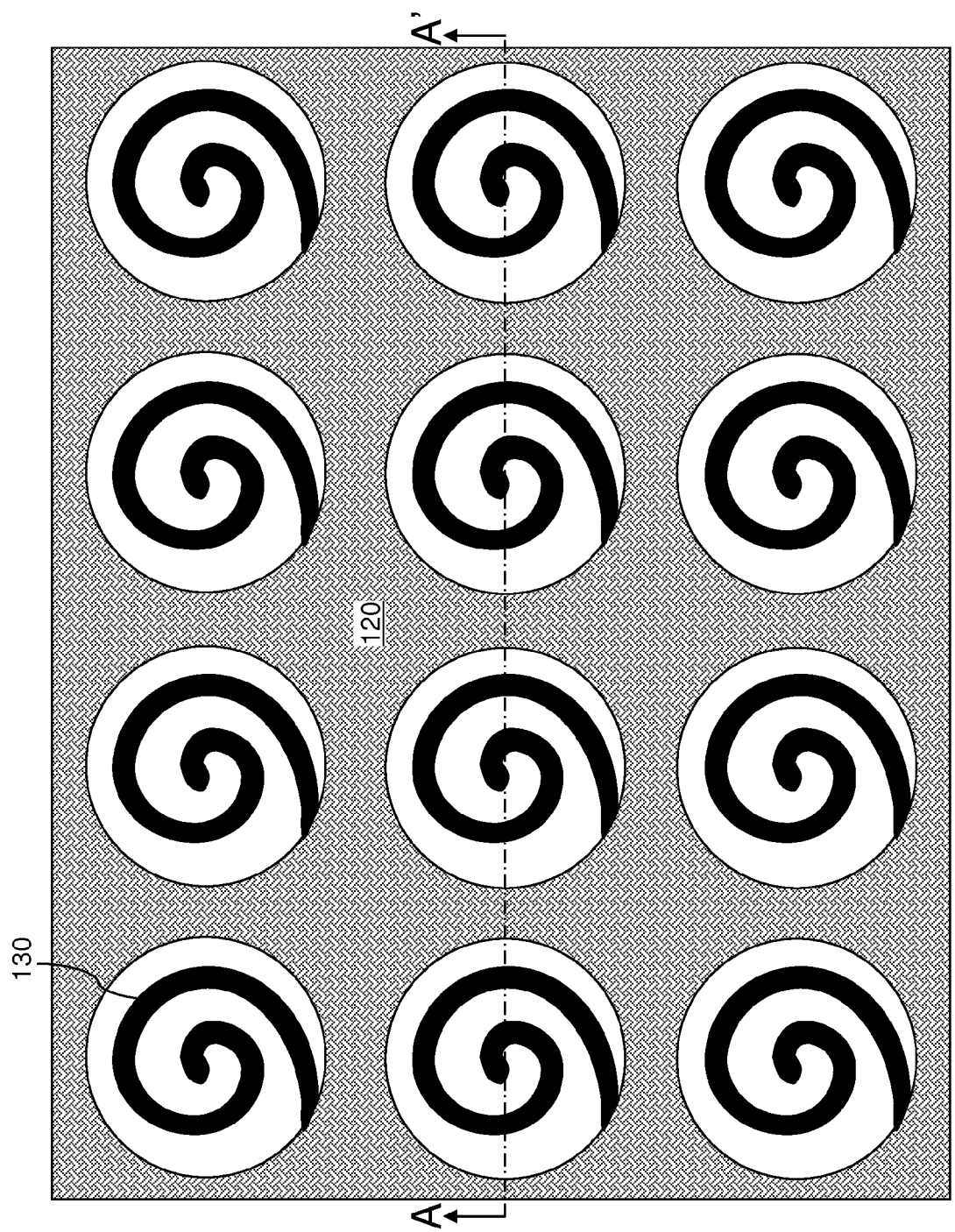
FIG. 5C is a horizontal cross-sectional view of the first exemplary structure along the plane C-C' in FIG. 5A. A vertical plane A-A' represents the vertical cross-sectional plane of FIG. 5A.

Referring to FIGS. 5A, 5B, and 5C, a silo structure 120 is placed over the photoresist 50. As used herein, a "silo" structure is a three-dimensional structure including a plurality of cylindrical holes therein. As used herein, a hole is "cylindrical" if the horizontal cross-sectional area of the hole is the same irrespective of the location of the horizontal cross-sectional view. The silo structure 120 is designed to include cylindrical holes, i.e., openings, in areas in which the plurality of protruding disposable template portions 30 are present. In one embodiment, the silo structure 120 can have a planar top surface and a planar bottom surface that is parallel to the planar top surface, and the plurality of cylindrical holes can extend between the planar top surface and the planar bottom surface. The horizontal cross-sectional shape of each cylindrical opening can be selected such that the entirety of a protruding disposable template portion 30 fits within the cylindrical opening. The horizontal cross-sectional shape of each cylindrical opening can be circular, elliptical, polygonal, curvilinear, or can have any closed two-dimensional shape.

If the plurality of protruding disposable template portions 30 forms a one-dimensional array having a pitch in one direction or a two-dimensional array having a pitch along each of the two directions of periodicity, the cylindrical openings in the silo structure 120 can have the same set of periodicity as the plurality of protruding disposable template portions 30.

The height of the silo structure 120 is selected such that the top surface of the silo structure 120 is located above the topmost surface of the photoresist 50. Further, the horizontal cross-sectional shape of the silo structure 120 can be selected such that the bottom surface of the silo structure 120 contacts the planar portions of the top surface of the photoresist 50, and do not contact the non-planar portions of the top surface of the photoresist 50. The planar portions of the top surface of the photoresist 50 overlie the planar portions of the photoresist 50 that are laterally surrounded by the plurality of protruding disposable template portions 30.

In one embodiment, the silo structure 120 can be a metal block including an array of holes therein. The array of holes can be formed by drilling through a solid metal block at locations corresponding to the areas of the plurality of protruding disposable template portions 30. In one embodiment, the silo structure 120 can be an aluminum block including an array of cylindrical holes therethrough.

In one embodiment, the sidewalls of the silo structure 120 can include a material that absorbs the electromagnetic radiation at the wavelength of illumination during a subsequent lithographic exposure of the photoresist 50. In one embodiment, the material of the silo structure 120 can be selected to absorb the electromagnetic radiation at the wavelength of lithographic exposure. In another embodiment, a light absorbing coating (such as an antireflective coating as known in the art) can be applied to the sidewalls of the cylindrical holes in the silo structure 120.

A first lithographic mask can be placed over the silo structure 120. The first lithographic mask can include a first transparent substrate 110 and a first patterned opaque layer 130. As used herein, a material is "transparent" if more than 90% of electromagnetic radiation passes through at a wavelength within the wavelength range from 1 nm to 1,000 nm, and a material is "opaque" if less than 10% of electromagnetic radiation passes through at a wavelength within the wavelength range from 1 nm to 1,000 nm. The first patterned opaque layer 130 includes a plurality of isolated opaque patterns located on the first transparent substrate 110. The first transparent substrate 110 includes an optically transparent material, i.e., a material that is optically transparent at the wavelength of electromagnetic radiation to be subsequently used to lithographically expose the photoresist 50. For example, the first transparent substrate 110 can include glass, quartz, sapphire, or any other optically transparent material that can provide mechanical strength to the first patterned opaque layer 130.

The first patterned opaque layer 130 includes a patterned opaque material such as chrome or molybdenum silicide (MoSi). The patterned opaque material is present over areas in which subsequent formation of metallic structures is desired. In one embodiment, the first patterned opaque layer 130 can include a pattern for forming a three-dimensional spiral shaped spring. In one embodiment, the first patterned opaque layer 130 can be present only within the areas of the openings in the silo structure 120. In one embodiment, each isolated portion of the first patterned opaque layer 130 can extend to a periphery of an opening in the silo structure 120 so as to enable subsequent formation of metallic structure that extend to planar portions of the photoresist 50.

In one embodiment, the first exemplary structure illustrated in FIGS. 5A, 5B, and 5C is a lithographic structure that includes a plurality of protruding disposable template portions 30 located on a substrate 10, a photoresist 50 disposed over the plurality of protruding disposable template portions 30 such that planar portions of the photoresist 50 are present among the plurality of protruding disposable template portions 30, a silo structure 120 including a plurality of openings and disposed on the planar portions of the photoresist 50 such that the plurality of openings overlie the plurality of protruding disposable template portions 30, and a first lithographic mask (110, 130) located over the silo structure 120.

The first lithographic mask can include a transparent substrate 110 and a plurality of isolated opaque patterns located on the transparent substrate 110. The plurality of isolated opaque patterns can be a two-dimensional periodic array of patterns. Further, the plurality of openings can be a two-dimensional periodic array of openings having a same periodicity as the two-dimensional periodic array of patterns.

Figure 6:
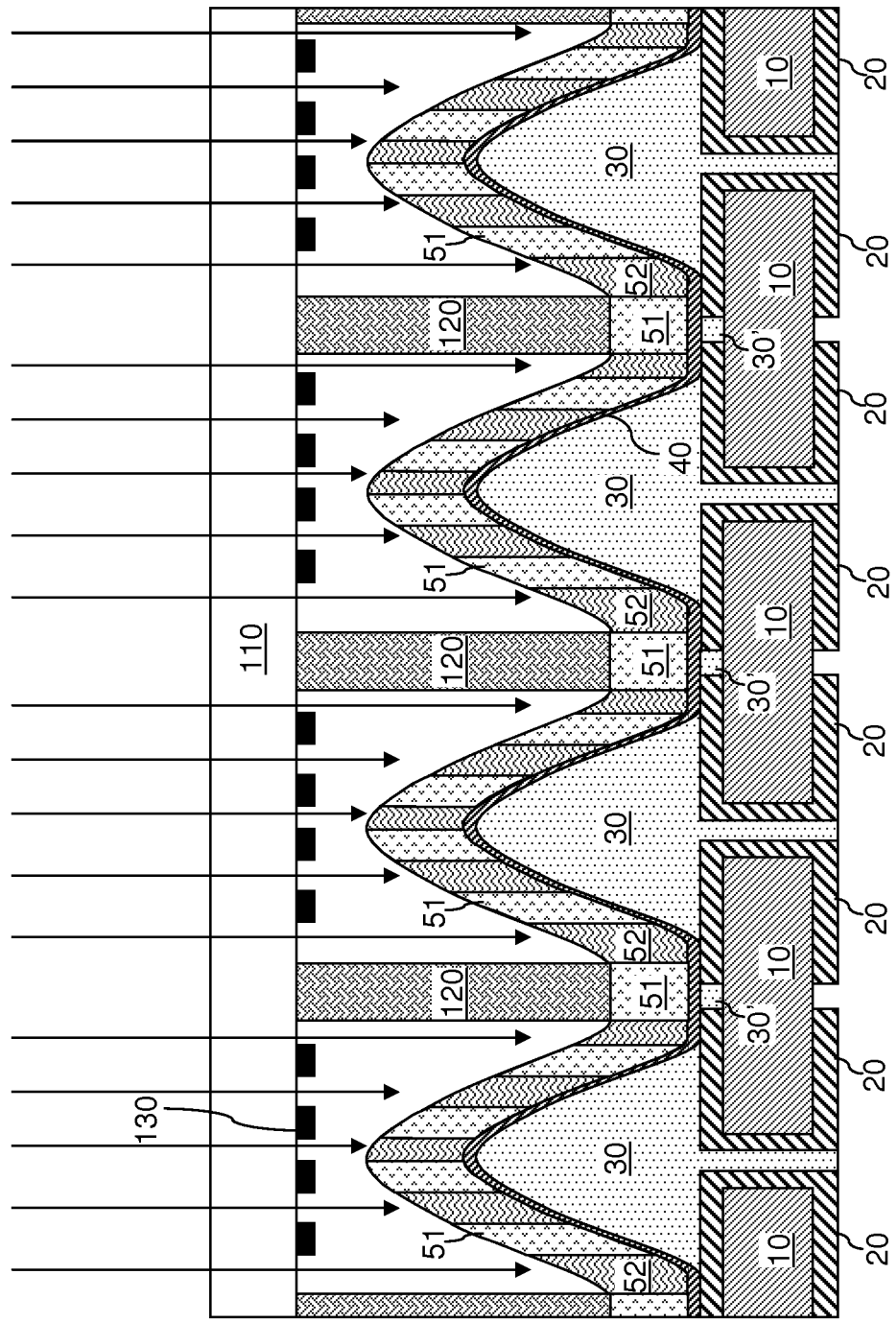
FIG. 6 is a vertical cross-sectional view of the first exemplary structure during lithographic exposure of the photoresist layer according to an embodiment of the present disclosure.

Referring to FIG. 6, the layer of the photoresist 50 is lithographically exposed by an illumination radiation (beam) that passes through the first lithographic mask (110, 130) and the silo structure 120. The combination of the first lithographic mask (110, 130) and the silo structure 120 functions as an illumination-pattern-defining structure. The illuminating radiation (represented by arrows) at a wavelength that causes chemical changes (e.g., cross-linking) in the photoresist 50 is directed through the transparent portions of the first lithographic mask (110, 130) that do not overlie the silo structure 120. The illuminated portions of the photoresist 50 become lithographically exposed photoresist portions 52, and the portions of the photoresist 50 that are not lithographically exposed are herein referred to as unexposed photoresist portions 51. The unexposed photoresist portions 51 have the same chemical composition as the photoresist 50 as originally formed, and are located directly underneath the silo structure 120 and in areas that are shielded from the illuminating radiation by the isolated opaque patterns of the first patterned opaque layer 130.

Figure 7:
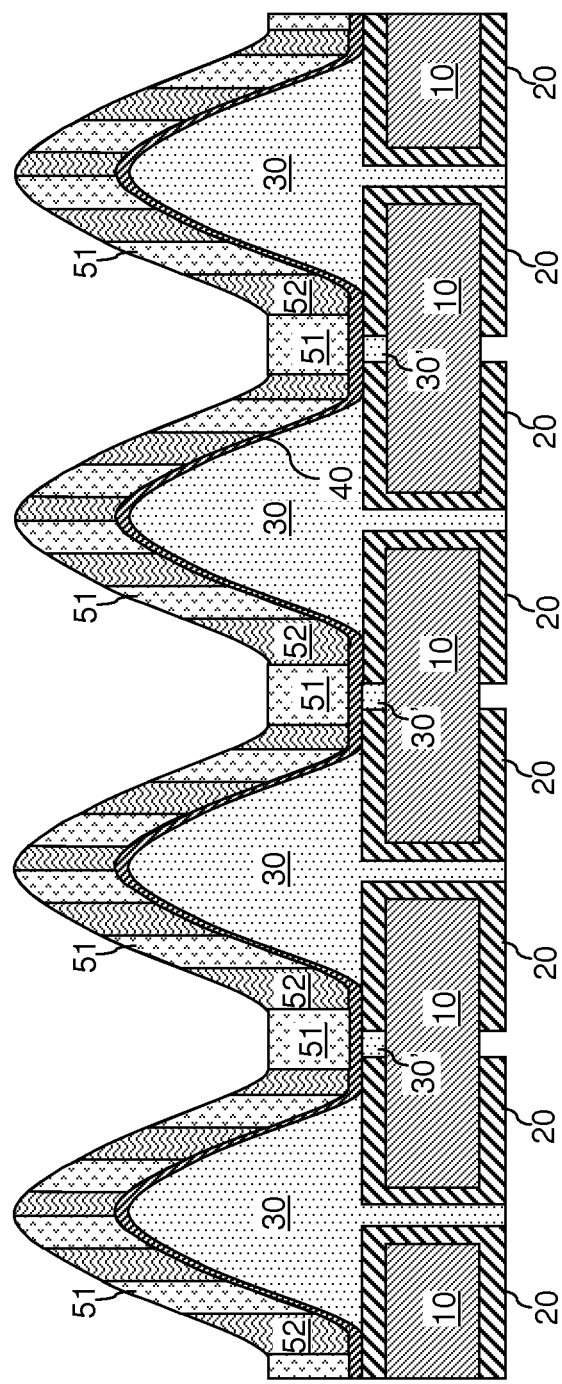
FIG. 7 is a vertical cross-sectional view of the first exemplary structure after removal of the silo structure from above the photoresist layer according to an embodiment of the present disclosure.

Referring to FIG. 7, the first lithographic mask (110, 130) and the silo structure 120 are removed from above the layer of the photoresist (51, 52).

Figure 8A:
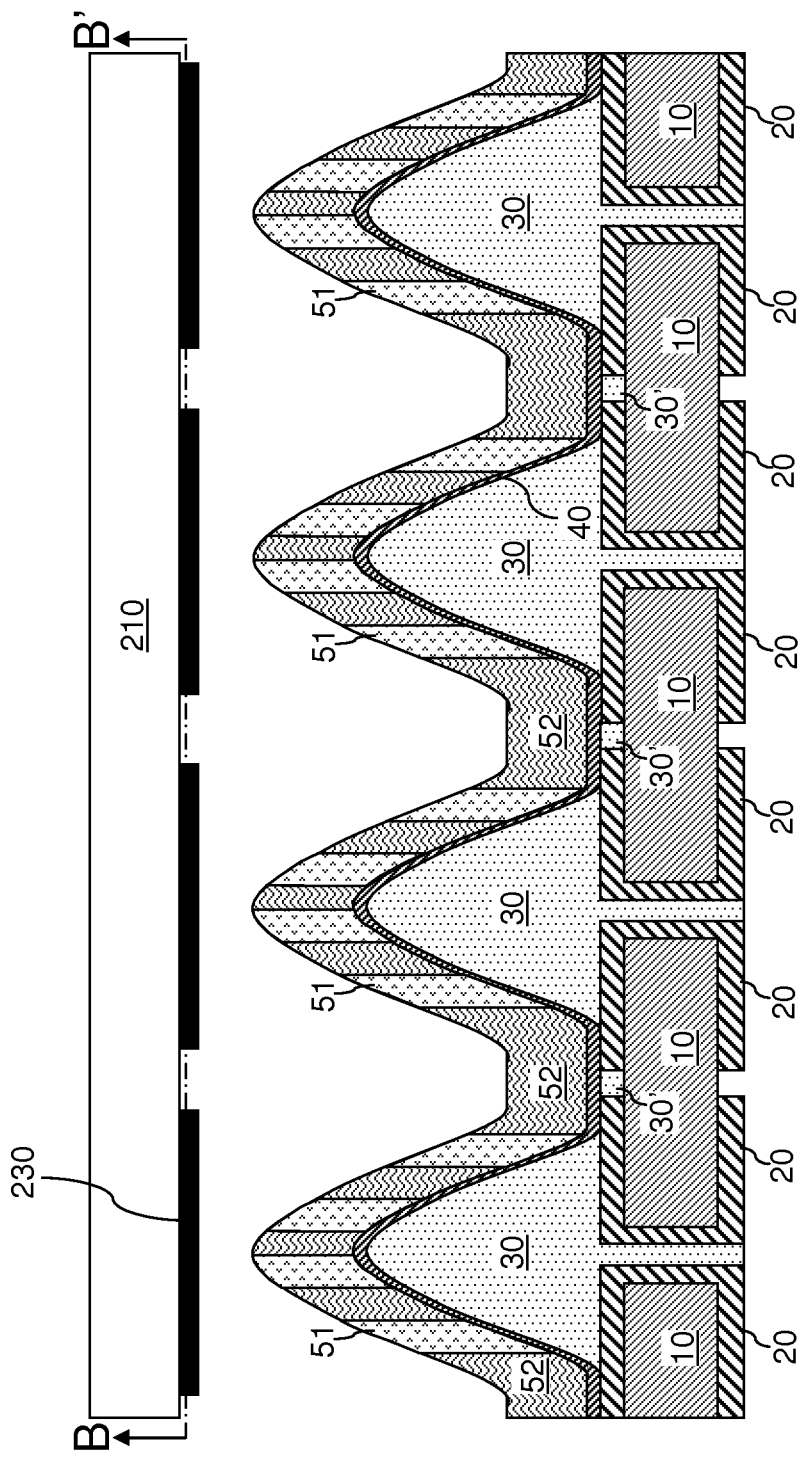
FIG. 8A is a vertical cross-sectional view of the first exemplary structure during lithographic exposure of the photoresist layer employing a second lithographic mask according to an embodiment of the present disclosure.
Figure 8B:
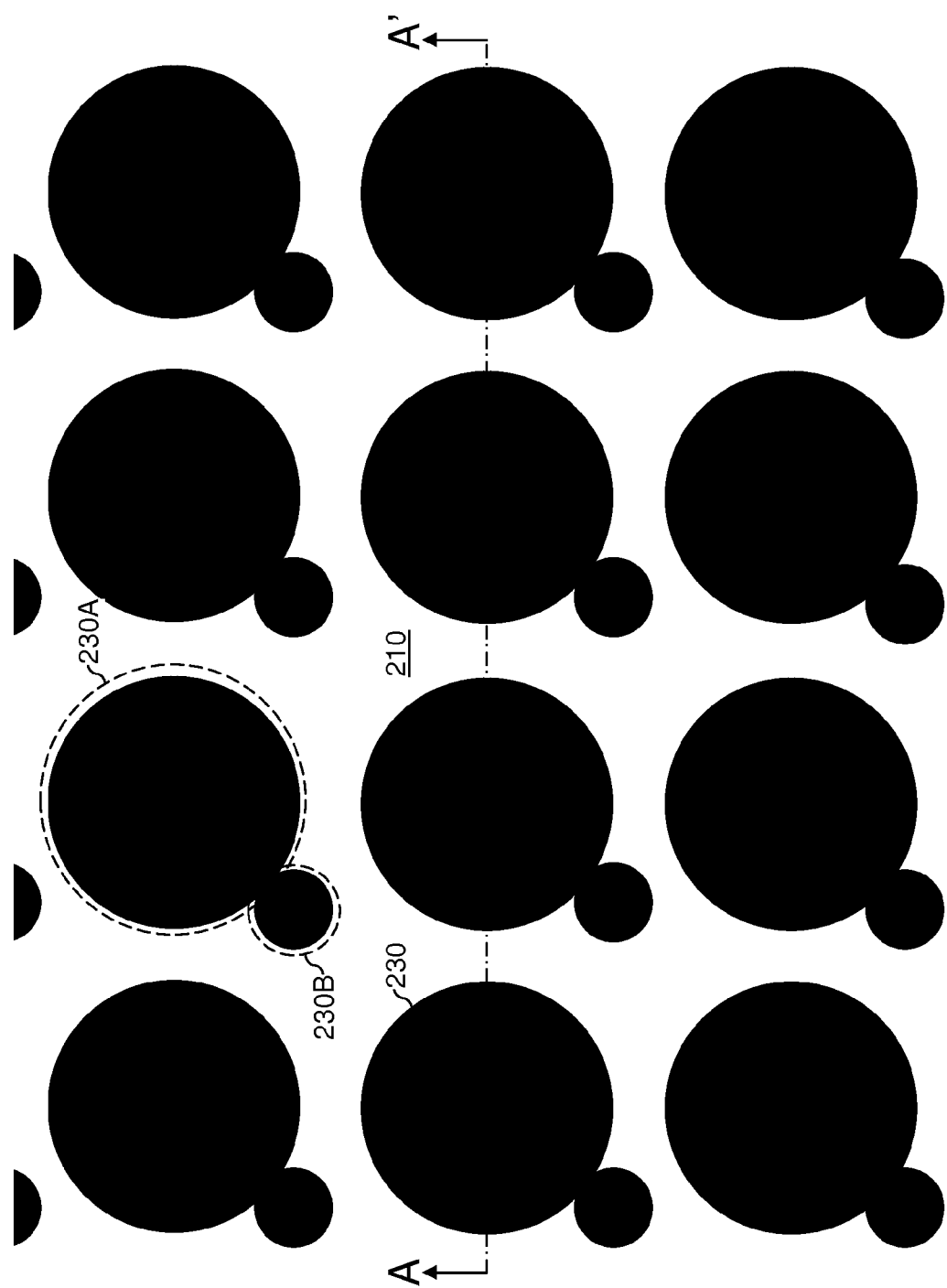
FIG. 8B is a horizontal cross-sectional view of the first exemplary structure along the plane B-B' in FIG. 8A. A vertical plane A-A' represents the vertical cross-sectional plane of FIG. 8A.
Figure 8C:
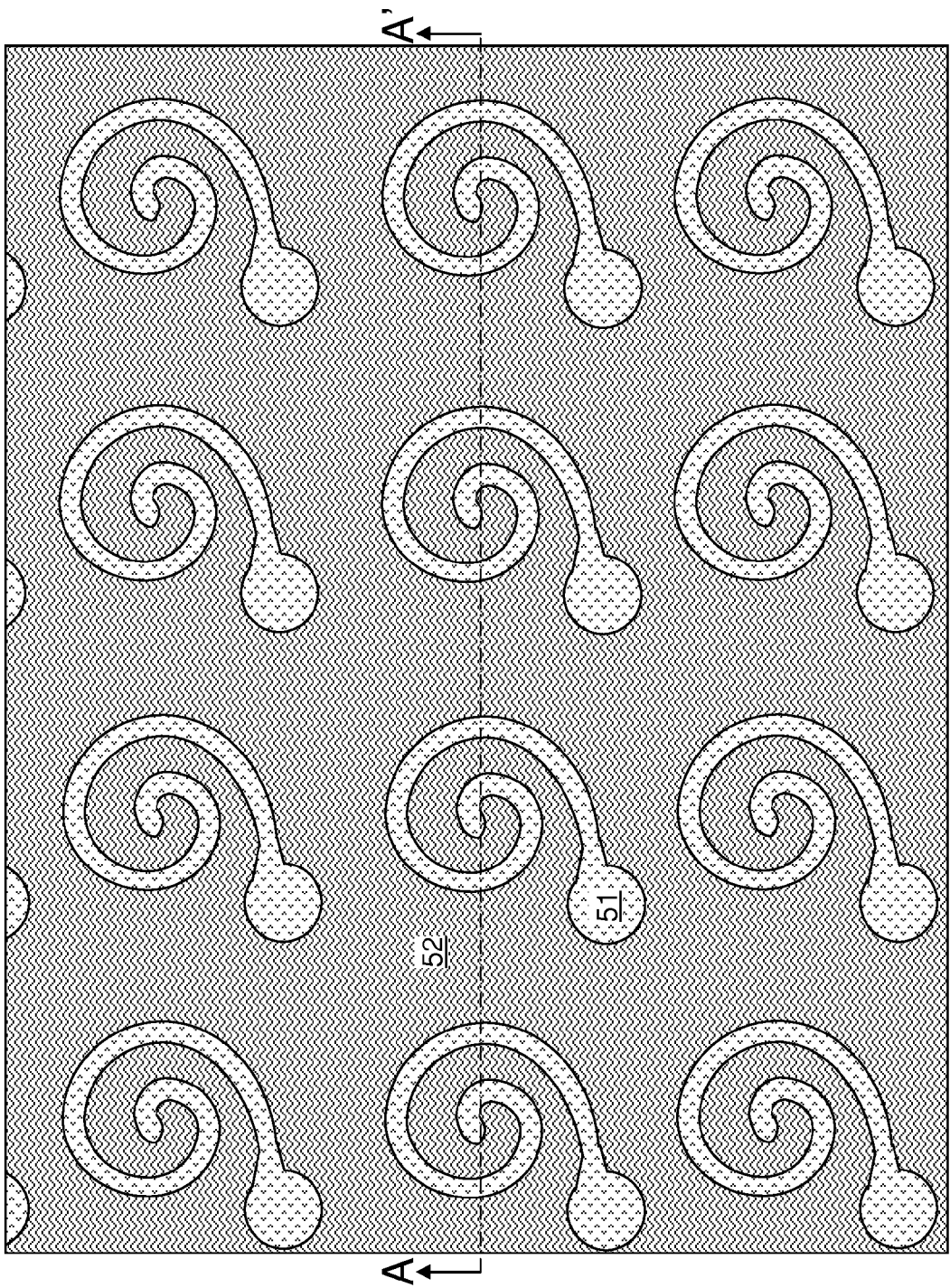
FIG. 8C is a top-down view of the portion of the first exemplary structure under the second lithographic mask in FIG. 8A. A vertical plane A-A' represents the vertical cross-sectional plane of FIG. 8A.

Referring to FIGS. 8A, 8B, and 8C, a second lithographic mask is placed over the layer of the photoresist (51, 52). The second lithographic mask includes a second transparent substrate 210 and a second patterned opaque layer 230. The second patterned opaque layer 230 can include a plurality of isolated opaque patterns located on the second transparent substrate 210. The second transparent substrate 210 includes an optically transparent material.

The second patterned opaque layer 230 includes a patterned opaque material. The second lithographic mask (210, 230) is placed over the layer of the photoresist (51, 52) such that the area of the patterned opaque material overlies the areas of the plurality of protruding disposable template portions 30. In one embodiment, the patterned opaque material of the second patterned opaque layer 230 can be positioned on the second transparent substrate 210 such that all areas of the layer of the photoresist (51, 52) previously positioned within the cylindrical openings of the silo structure 120 at the processing steps of FIGS. 5A, 5B, 5C, and 6 underlie the patterned opaque material of the second patterned opaque layer 230.

In one embodiment, each isolated opaque pattern in the second patterned opaque layer 230 can include a protrusion covering region 230A that overlies a protruding disposable template portion 30 and encompass an area physically exposed within an opening of the silo structure 120 at the processing steps of FIGS. 5A, 5B, 5C, and 6. In one embodiment, each isolated opaque pattern in the second patterned opaque layer 230 can include a planar-portion covering region 230B, which overlies the planar portion of the layer of the photoresist (51, 52).

The layer of the photoresist (51, 52) is lithographically exposed employing the second lithographic mask (210, 230). Sub-portions of the unexposed photoresist portions 51 are lithographically exposed, e.g., cross-linked, to form additional lithographically exposed photoresist portions 52. Thus, the total area of the lithographically exposed photoresist portions 52 increased and the total area of the unexposed photoresist portions 51 decreased during the second lithographic exposure of the layer of the photoresist (51, 52) employing the second lithographic mask (210, 230).

In one embodiment, the second lithographic mask (210, 230) can include a plurality of opaque portions that overlie the plurality of protruding disposable template portions 30 during the lithographically exposing of the photoresist employing the second lithographic mask (210, 230). For example, the plurality of opaque portions can include a plurality of protrusion covering regions 230A. In one embodiment, the plurality of protrusion covering regions 230A and the plurality of openings in the silo structure 120 can have the same pattern. The plurality of opaque portions of the second patterned opaque layer 230 can form a two-dimensional periodic array of opaque portions. In one embodiment, the plurality of openings in the silo structure 120 can be a two-dimensional periodic array of openings having the same periodicity as the two-dimensional periodic array of opaque portions in the second patterned opaque layer 230.

In one embodiment, the second lithographic mask (210, 230) can further include a plurality of additional opaque portions overlying the planar portions of the photoresist during the lithographically exposing of the layer of the photoresist (51, 52) employing the second lithographic mask (210, 230). For example, the plurality of additional opaque portions can be a plurality of planar-portion covering region 230B.

In one embodiment, the area of each planar-portion covering region 230B can be located such that the image of the planar-portion covering region 230B is formed on an end portion of a preexisting unexposed photoresist portion 51 present within the area of an opening in the silo structure 120.

The unexposed photoresist portions 51 after the second lithographic exposure can be isolated from one another by a contiguous layer of lithographically exposed photoresist portions 52 that laterally embeds each of the unexposed photoresist portions 51. In one embodiment, the unexposed photoresist portions 51 after the second lithographic exposure can be in the form of isolated spiral-shaped regions as illustrated in FIG. 8C. In one embodiment, the unexposed photoresist portions 52 can form a one-dimensional array or a two-dimensional array of isolated spiral-shaped regions. In one embodiment, the unexposed photoresist portions 52 can form a periodic one-dimensional array or a periodic two-dimensional array of isolated spiral-shaped regions.

Figure 9:
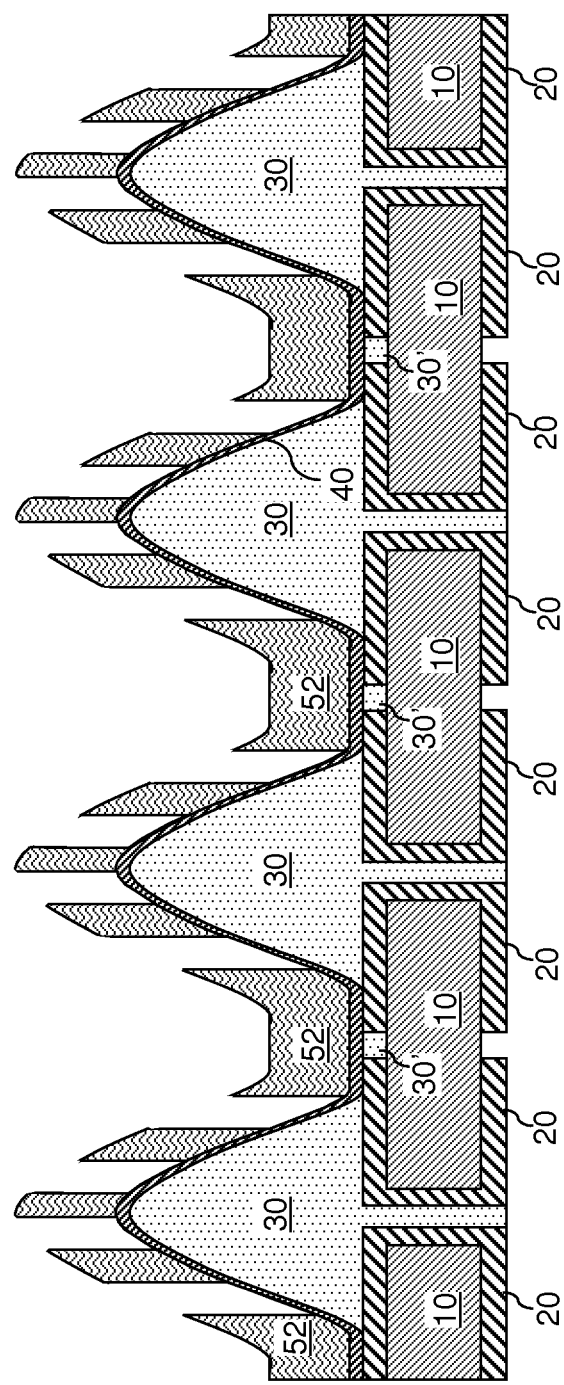
FIG. 9 is a vertical cross-sectional view of the first exemplary structure after development according to an embodiment of the present disclosure.

Referring to FIG. 9, the layer of the photoresist (51, 52) is developed, for example, employing a solvent that removes the unexposed photoresist portions 51 while not removing the contiguous layer of the lithographically exposed photoresist portions 52. A cavity is formed within each volume from which an unexposed photoresist portion 51 is removed. A surface of the metallic seed layer 40 is physically exposed at the bottom of each cavity.

Figure 10:
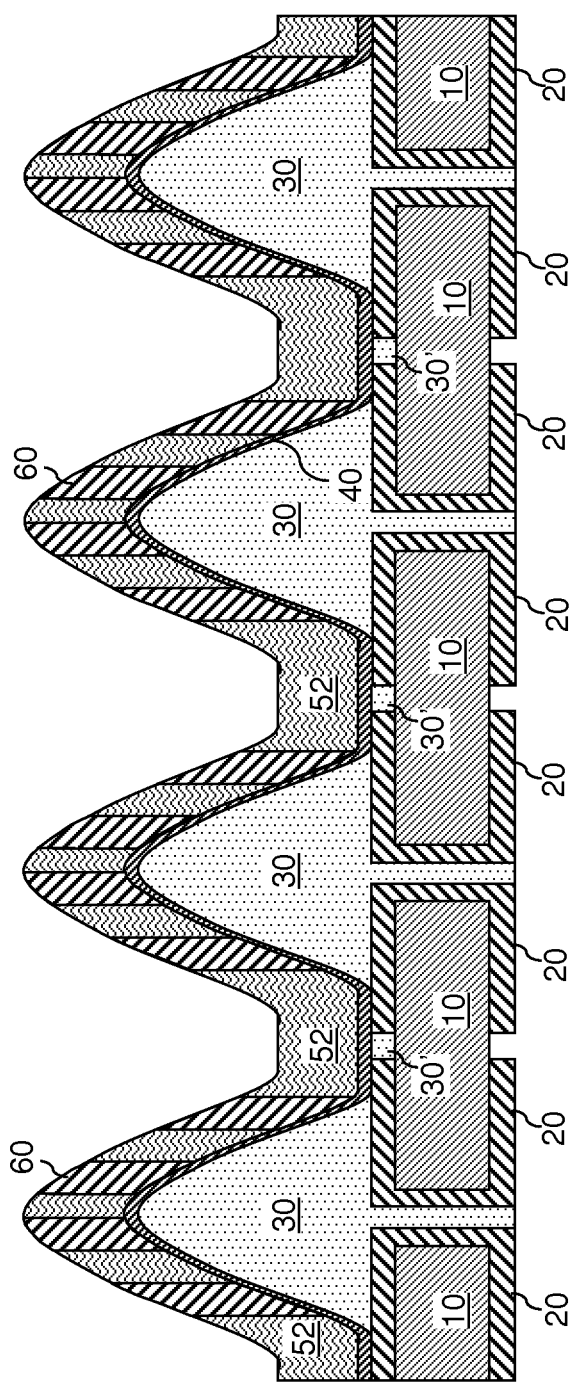
FIG. 10 is a vertical cross-sectional view of the first exemplary structure after plating of at least one metallic material to form three-dimensional metallic structures according to an embodiment of the present disclosure.

Referring to FIG. 10, at least one metallic material is deposited in the cavities defined by the contiguous layer of the lithographically exposed photoresist portions 52. The at least one metallic material can be deposited in the cavities, for example, by electroplating or electroless plating. A metallic material portion 60 is formed within each cavity. Specifically, the at least one metallic material can be deposited directly on portions of the metallic seed layer 40 at bottom surfaces of the plurality of cavities.

The thickness of the metallic material portions 60 can be any thickness up to the thickness of the contiguous layer of the lithographically exposed photoresist portions 52. In one embodiment, the thickness of the metallic material portions 60, as measured at planar portions (See FIG. 12C) can be from 30 nanometers to 100 microns, although lesser and greater thicknesses can also be employed. In one embodiment, the metallic material portions 60 can be formed by deposition of a metallic material including nickel, copper, and optionally silicon.

In one embodiment, the step of depositing at least one metallic material in the plurality of cavities can be performed by electrochemically co-depositing copper and nickel at a nickel atomic concentration in a range from 0.5% to 4.0%. In one embodiment, the cavities can be filled by co-electroplating of 1.5% nickel in copper. Optionally, a layer of silicon material can be deposited on top of the at least one metallic material. The layer of silicon material can be deposited, for example, by physical vapor deposition (PVD) or by any other methods. In one embodiment, the thickness of the layer of silicon can be selected such that the amount of added silicon material corresponds to a range from 0.2% to 0.5% in atomic percentage of all materials in the cavities.

The combination of the metallic material portions 60 and the metallic seed layer 40 collectively constitute three-dimensional metallic structures. As used herein, a "three-dimensional" structure refers to a structure in which a top surface and/or a bottom surface of the structure are not in a horizontal plane. The three-dimensional metallic structures (40, 60) are in contact with top surfaces of the plurality of metallic pads 20.

Figure 11:
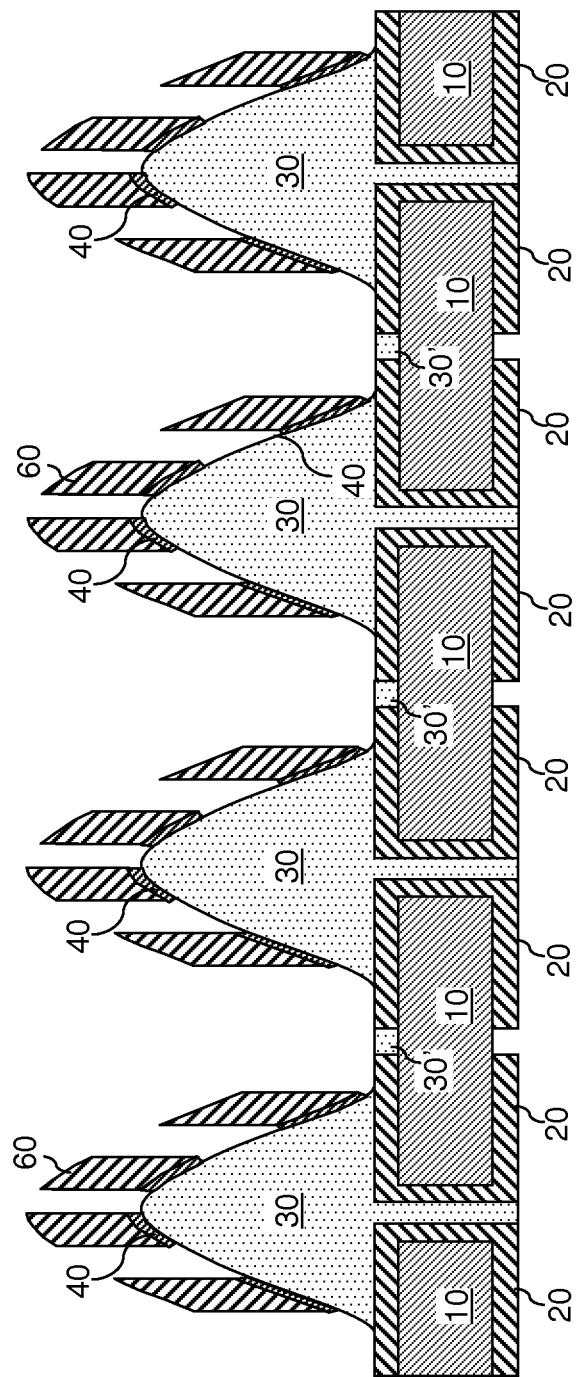
FIG. 11 is a vertical cross-sectional view of the first exemplary structure after removal of the lithographically exposed photoresist portions and physically exposed portions of the metallic seed layer according to an embodiment of the present disclosure.

Referring to FIG. 11, the lithographically exposed photoresist portions 52 are removed selective to the metallic material portions 60, for example, by ashing. Subsequently, physically exposed portions of the metallic seed layer 40 are removed, for example, by a wet etch. The etch may be selective to the at least one metallic material or the metallic material portions 60, or may collaterally etch some of the metallic material portions 60.

Figure 12A:
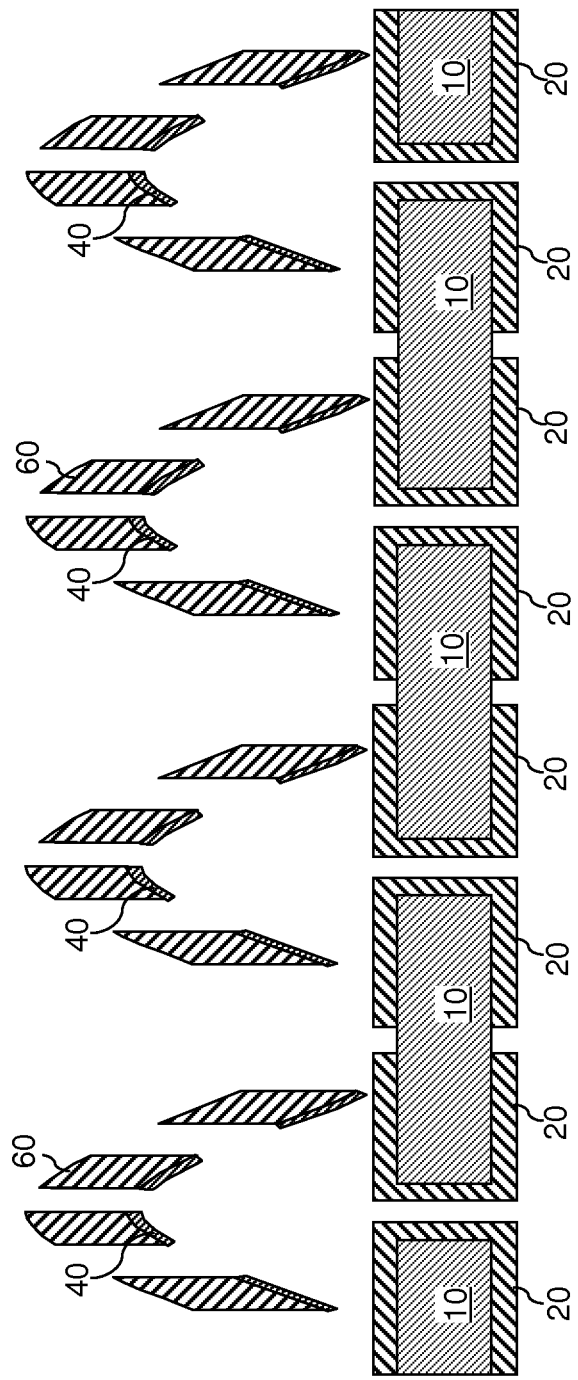
FIG. 12A is a vertical cross-sectional view of the first exemplary structure after removal of the plurality of protruding disposable template portions according to an embodiment of the present disclosure.
Figure 12B:
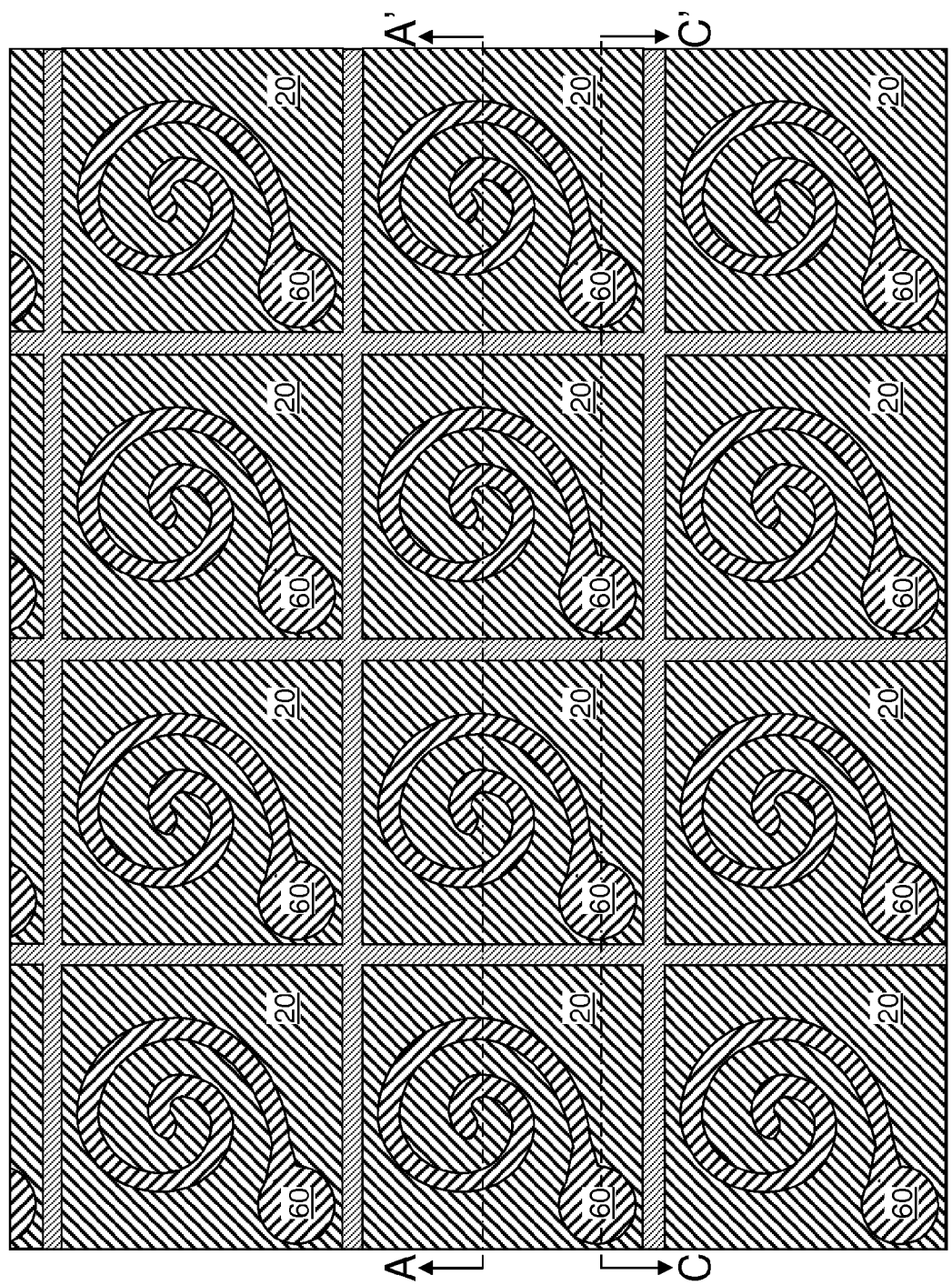
FIG. 12B is a top-down view of the first exemplary structure of FIG. 12A. A vertical plane A-A' represents the vertical cross-sectional plane of FIG. 12A.
Figure 12C:
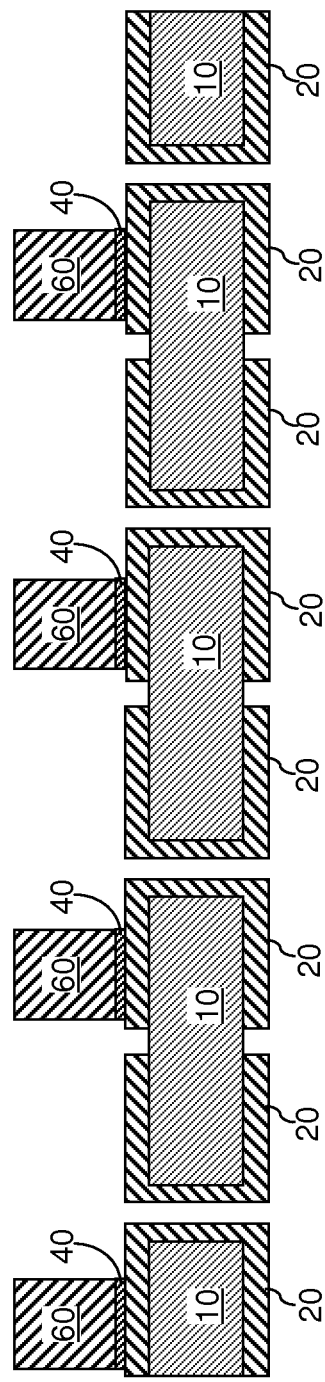
FIG. 12C is a vertical cross-sectional view of the first exemplary structure along the vertical cross-sectional plane C-C' of FIG. 12B.

Referring to FIGS. 12A, 12B, and 12C, the plurality of protruding disposable template portions 30 are removed, for example, by immersing the first exemplary structure in a solvent that dissolves the material of the plurality of protruding disposable template portions 30. If the plurality of protruding disposable template portions 30 includes an organic polymer, the solvent can be a solvent that dissolves organic materials, e.g., acetone. Additionally or alternately, the protruding disposable template portions 30 can be removed by a thermal decomposition process at an elevated temperature. For example, the protruding disposable template portion 30 can be thermally decomposed in vacuum, in oxygen-containing reduced pressure environment, in an atmospheric environment, or in an environment of at least one inert gas (such as nitrogen, argon or hydrogen mixtures thereof, which are referred to as forming gas blends.). The temperature of the thermal decomposition process can be, for example, from 200° C. to 800° C., although lower and greater temperatures can also be employed.

In one embodiment, the at least one metallic material and the layer of silicon material can be annealed to homogenize the at least one metallic material and the silicon material. Optionally, the duration of the anneal can be selected to homogenize the at least one metallic material, the layer of silicon material, and the material of the metallic seed layer 40 (which can include copper). In one embodiment, the composition and thickness of the various components and layers in the metallic seed layer 40 and the metallic material portions 60 can be selected such that the atomic concentration of silicon is in a range from 0.2% to 0.6%, the atomic concentration of nickel is from 0.5% to 4.0%, and the atomic concentration of the copper is the balance percentage.

In one embodiment, after removal of the lithographically exposed photoresist portions 52 and the plurality of protruding disposable template portions 30, the metallic material portions 60 can optionally be annealed at an elevated temperature to homogenize the various materials therein. For example, if the metallic material portions 60 include nickel, copper, and silicon, the three materials of nickel, copper, and silicon can be annealed at a temperature between 675° C. to 887° C. for a time duration in a range from 2 hours to 32 hours to form a solid solution of nickel, copper, and silicon. In one embodiment, the homogenized metallic material portions 60 can be rapidly cooled (quenched) to a low temperature (e.g. room temperature), and can then reheated to an intermediate temperature (e.g., between 200° C. and 400° C. for a time duration in a range between 15 minutes and 4 hours) to induce precipitation of nickel silicide particles, which act as hardening component to enhance mechanical and electrical properties.

In one embodiment, the removal of the lithographically exposed photoresist portions 52, the removal of the plurality of protruding disposable template portions 30, and the thermal anneal at an elevated temperature that homogenizes the various materials within the metallic material portions 60 can be performed simultaneously within a single anneal process, during which the lithographically exposed photoresist portions 52 and the plurality of protruding disposable template portions 30 are removed by thermal decomposition while the metallic material portions 60 are homogenized to form a solid solution of multiple component materials including at least one metal.

In one embodiment, the three-dimensional metallic structures (40, 60) can include the remaining portions of the metallic seed layer 40 and the metallic material portions 60. In one embodiment, each three-dimensional metallic structure (40, 60) can be a physically isolated from other three-dimensional metallic structures (40, 60), i.e., not in physical contact with one another). In another embodiment, each three-dimensional metallic structure (40, 60) can physically contact an underlying metallic pad 20.

In a further embodiment, each three-dimensional metallic structure (40, 60) can be a three-dimensional spring in contact with one of the plurality of metallic pads 30. In one embodiment, an electrically conductive path can be provided between each pair of a three-dimensional metallic structure (40, 60) and a metallic pad.

Figure 13:
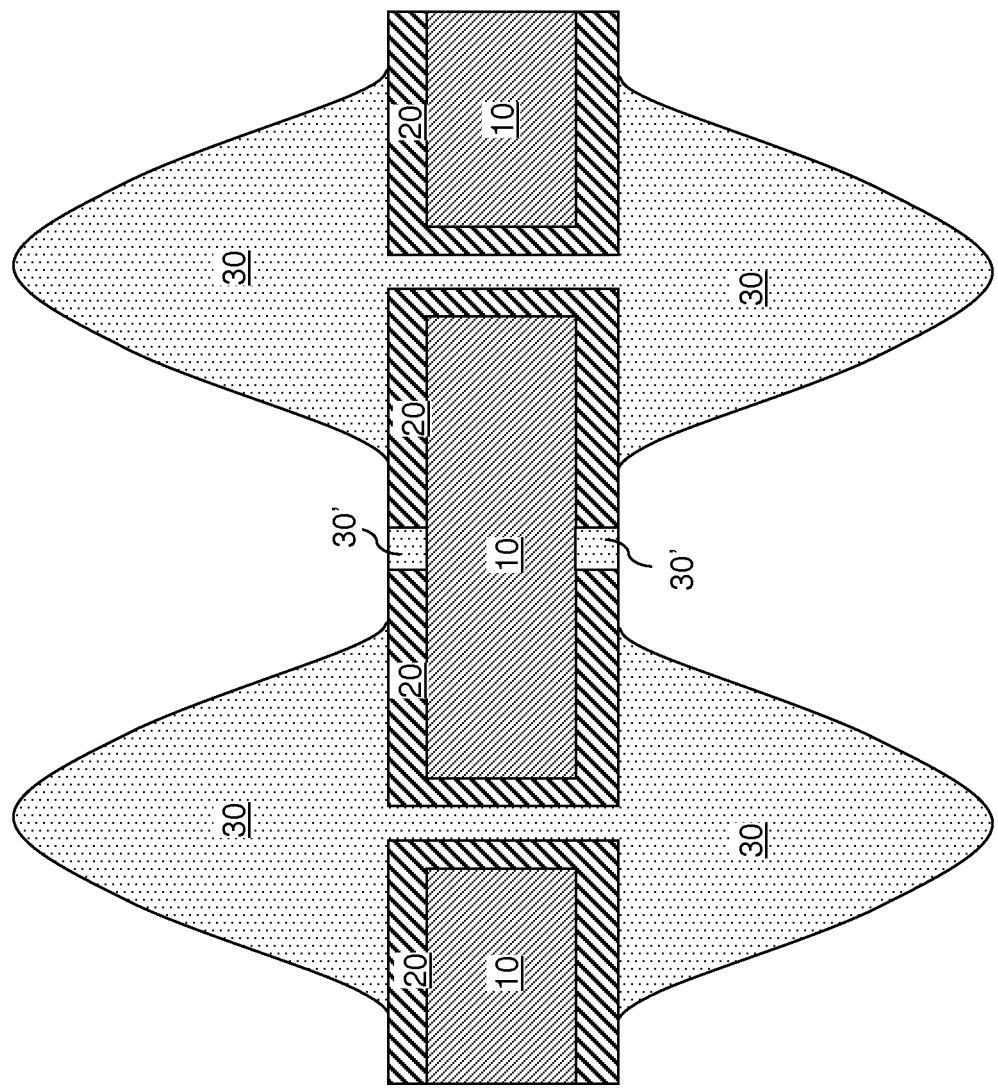
FIG. 13 is a vertical cross-sectional view of a second exemplary structure after formation of a plurality of protruding disposable template portions according to an embodiment of the present disclosure.

Referring to FIG. 13, a second exemplary structure according to an embodiment of the present disclosure can be derived from the first exemplary structure of FIGS. 2A and 2B by forming a first plurality of protruding disposable template portions 30 on one side of the assembly of the substrate 10 and the plurality of metallic pads 20, and by forming a second plurality of protruding disposable template portions 30 on the opposite side of the assembly of the substrate 10 and the plurality of metallic pads 20.

Figure 14:
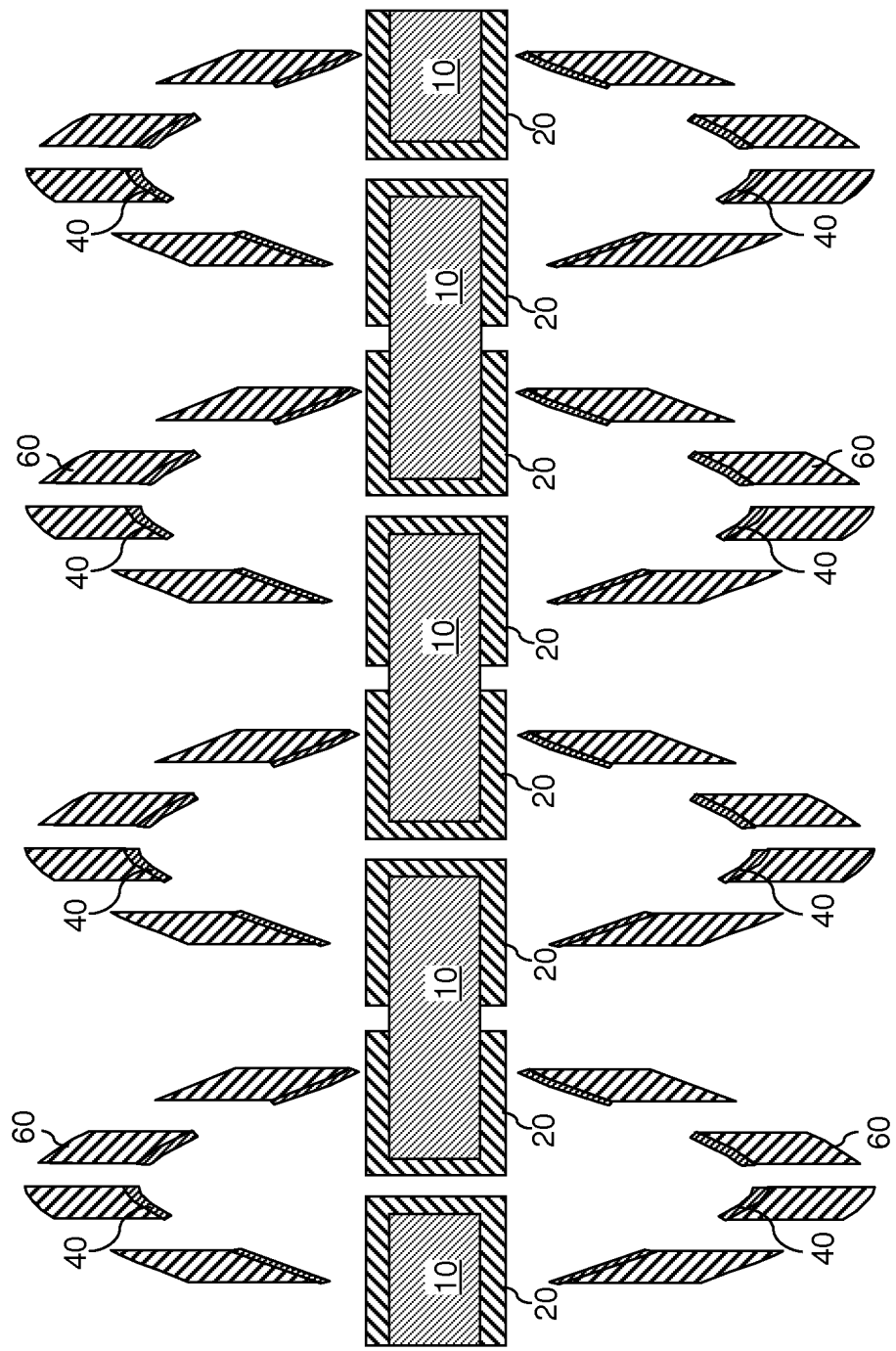
FIG. 14 is a vertical cross-sectional view of the second exemplary structure after removal of the plurality of protruding disposable template portions according to an embodiment of the present disclosure.

Referring to FIG. 14, each of the processing steps employed to form the first exemplary structure illustrated in FIGS. 12A, 12B, and 12C is performed on both sides of the assembly of the substrate 10 and the plurality of metallic pads 20 to provide the second exemplary structure of FIG. 14. In one embodiment, an array of electrically conductive springs can be formed as a plurality of three-dimensional metallic structures (40, 60) on both sides of the assembly of the substrate 10 and the plurality of metallic pads 20.

In one embodiment, the structures disclosed herein can be employed to form a high density interposer structure that provides electrical contacts to microstructures such as electro-optic transceivers. Alternately, the structure disclosed herein can be employed to pattern a plurality of three-dimensional metallic structures that can be used for any other purposes.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the invention and the following claims.

What is claimed is:

1. A structure used for electroplating metal, comprising:
   a substrate;
   a plurality of protruding disposable template portions formed on the substrate;
   a photoresist disposed on said plurality of protruding disposable template portions, wherein said photoresist comprises a plurality of non-planar portions and a plurality of planar portions, wherein each of said plurality of non-planar portions overlies a respective protruding disposable template portion and each of the said plurality of planar portions is provided between two adjacent non-planar portions;
   a material block disposed on said planar portions of said photoresist, wherein said material block defines a plurality of openings, wherein each opening of said plurality of openings overlies a respective non-planar portion and a respective protruding disposable template portion to allow said respective non-planar portion and said respective protruding disposable template portion to protrude into said each opening; and
   a lithographic mask placed on said material block.

2. The structure of claim 1, wherein said lithographic mask comprises a transparent substrate and a plurality of isolated opaque patterns formed on said transparent substrate of said lithographic mask.

3. The structure of claim 2, wherein said plurality of isolated opaque patterns is a two-dimensional periodic array of patterns.

4. The structure of claim 3, wherein said plurality of openings is a two-dimensional periodic array of openings having a same periodicity as said two-dimensional periodic array of patterns.

5. The structure of claim 1, further comprising a plurality of metallic pads formed directly on said substrate, wherein said plurality of protruding disposable template portions are formed directly on said plurality of metallic pads.

6. The structure of claim 1, further comprising:
   a plurality of metallic pads formed directly on said substrate, wherein said plurality of protruding disposable template portions are formed directly on said plurality of metallic pads; and
   a metallic seed layer formed directly on portions of said plurality of metallic pads and said plurality of disposable template portions.

7. The structure of claim 1, wherein said protruding disposable template portions comprise polymer bumps.

8. The structure of claim 1, wherein said material block has a planar top surface and a planar bottom surface that is parallel to the planar top surface, and wherein said plurality of openings extend between the planar top surface and the planar bottom surface.

9. The structure of claim 8, wherein said plurality of openings comprises cylindrical holes.

10. The structure of claim 9, wherein an entirety of said protruding disposable template portion fit within said cylindrical holes.

11. The structure of claim 1, wherein said material block comprises a metal block.

12. The structure of claim 1, wherein sidewalls of said plurality of openings of said material block comprise a material that absorbs electromagnetic radiation.

13. The structure of claim 1, wherein each opening of said plurality of openings in said material block has a closed two-dimensional shape.

14. The structure of claim 13, wherein each opening of said plurality of openings in said material block is circular, elliptical, polygonal, or curvilinear.

15. The structure of claim 1, wherein a height of said material block is selected such that a top surface of said material block is located above a topmost surface of said photoresist.

* * * * *